United States Patent
Wang et al.

(10) Patent No.: US 11,380,856 B2
(45) Date of Patent: Jul. 5, 2022

(54) FLEXIBLE ELEMENT, FLEXIBLE DISPLAY DEVICE AND MANUFACTURING METHOD THEREOF

(71) Applicant: BOE TECHNOLOGY GROUP CO., LTD., Beijing (CN)

(72) Inventors: Haoran Wang, Beijing (CN); Dejun Bu, Beijing (CN); Paoming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/620,897

(22) PCT Filed: Jan. 9, 2019

(86) PCT No.: PCT/CN2019/070945
§ 371 (c)(1),
(2) Date: Dec. 10, 2019

(87) PCT Pub. No.: WO2019/218710
PCT Pub. Date: Nov. 21, 2019

(65) Prior Publication Data
US 2021/0083210 A1  Mar. 18, 2021

(30) Foreign Application Priority Data

May 18, 2018  (CN) .......................... 201810480205.2

(51) Int. Cl.
*H01L 51/00* (2006.01)
*B32B 3/26* (2006.01)
(Continued)

(52) U.S. Cl.
CPC .......... *H01L 51/0097* (2013.01); *B32B 3/266* (2013.01); *B32B 3/28* (2013.01);
(Continued)

(58) Field of Classification Search
CPC ................. H01L 51/0097; H01L 27/32; H01L 2251/5338; B32B 3/266; B32B 3/28;
(Continued)

(56) References Cited

U.S. PATENT DOCUMENTS 5,558,923 A * 9/1996 Vesamaa ................ B31D 5/006
428/137
2016/0192478 A1  6/2016  Kuo et al.
(Continued)

FOREIGN PATENT DOCUMENTS

CN  105047676 A  11/2015
CN  106328599 A  1/2017
(Continued)

OTHER PUBLICATIONS

First Office Action for Chinese Patent Application No. 201810480205.2 dated Apr. 19, 2019.
Second Office Action for Chinese Patent Application No. 201810480205.2 dated Oct. 22, 2019.

*Primary Examiner* — Catherine A. Simone
(74) *Attorney, Agent, or Firm* — Calfee, Halter & Griswold LLP

(57) ABSTRACT

A flexible element configured to be disposed on a surface of a non-display substrate of a flexible display panel includes: a first base layer and a second base layer which are oppositely arranged with each other; and a buffer layer sandwiched between the first base layer and the second base layer. The flexible element can be bent around a bending axis. A projection of the buffer layer on a plane perpendicular to the bending axis is wave-shaped.

17 Claims, 7 Drawing Sheets

(51) Int. Cl.
*B32B 3/28* (2006.01)
*B32B 7/12* (2006.01)
*B32B 15/18* (2006.01)
*B32B 15/20* (2006.01)
*H01L 27/32* (2006.01)

(52) U.S. Cl.
CPC ............... *B32B 7/12* (2013.01); *B32B 15/18* (2013.01); *B32B 15/20* (2013.01); *H01L 27/32* (2013.01); *B32B 2307/546* (2013.01); *B32B 2457/20* (2013.01)

(58) Field of Classification Search
CPC ........... B32B 7/12; B32B 15/18; B32B 15/20; B32B 2307/546; B32B 2457/20; Y10T 428/24661; Y10T 428/24694; Y10T 428/24711; Y10T 428/24719; Y10T 428/24727; Y10T 428/24273; Y10T 428/24322; Y10T 428/24347; Y10T 428/24298; Y10T 428/24314; Y10T 428/24331; Y10T 428/24306; G09F 9/301; G02F 1/133305
See application file for complete search history.

(56) References Cited

U.S. PATENT DOCUMENTS

| | | | |
|---|---|---|---|
| 2017/0200678 | A1 | 7/2017 | Zhang et al. |
| 2017/0212556 | A1* | 7/2017 | Jovanovic ............. G06F 1/1652 |
| 2018/0190936 | A1* | 7/2018 | Lee ..................... H01L 51/5237 |
| 2019/0067638 | A1* | 2/2019 | Huang ................ H01L 51/5256 |
| 2019/0189971 | A1 | 6/2019 | Sun |

FOREIGN PATENT DOCUMENTS

| | | |
|---|---|---|
| CN | 106530973 A | 3/2017 |
| CN | 107104200 A | 8/2017 |
| CN | 206595261 U | 10/2017 |
| CN | 206610569 U | 11/2017 |
| CN | 107564415 A | 1/2018 |
| CN | 207134153 U | 3/2018 |
| CN | 107909927 A | 4/2018 |
| CN | 207264694 U | 4/2018 |
| CN | 108022944 A | 5/2018 |
| CN | 108470523 A | 8/2018 |
| KR | 20180069762 A | 6/2018 |

* cited by examiner

FLEXIBLE ELEMENT, FLEXIBLE DISPLAY DEVICE AND MANUFACTURING METHOD THEREOF

CROSS REFERENCE TO RELATED APPLICATIONS

This application is a 35 U.S.C. 371 national stage application of PCT International Application No. PCT/CN2019/070945, filed on Jan. 9, 2019, which claims the priority of a Chinese patent application No. 201810480205.2 filed on May 18, 2018, the entire disclosure of which is incorporated herein by reference.

FIELD

The embodiments of the present disclosure relate to the technical field of electronic displays, and particularly to a flexible display device, a manufacturing method thereof, and a flexible element used in the flexible display device.

BACKGROUND

Intellectualization, portability and flexibility are the main development directions of an electronic device at present. An OLED display panel is a display panel made of an organic light-emitting diode (OLED). The OLED display panel has attracted more and more attention and recognition due to its lightness and thinness (without a backlight), high brightness and high definition in image display, deformability and bendability (i.e. flexibility), energy saving and other characteristics, especially the outstanding characteristic of flexibility. At present, more and more electronic devices adopt OLED flexible display panels. The flexible display panel is a deformable and bendable display panel made of flexible materials.

The most prominent advantage of a flexible display panel over traditional rigid display panels is that it breaks through the original inherent concept of two-dimensional display and expands the application field of a display to more dimensional and more portable electronic devices. As one of the development directions of the new generation of flexible display technology, foldable displays have received extensive attention in the industry. However, flexible display panels also have their own shortcomings and deficiencies. For example, flexible display panels are relatively thin and light, and as a result, they have poor bending resistance and impact resistance. Local large deformation amounts caused by frequent bending may lead to degeneration of polymer materials in the display panel, and even "creases", "white lines" and other phenomena in the bending region, resulting in failure of the display panel. Therefore, it is necessary to improve the bending resistance and impact resistance of the flexible display panel.

At present, the improvement of bending resistance and impact resistance of flexible display panels usually starts with the following two ways: one way is to start with the internal structure of flexible display panels, i.e. to improve the internal structure and material of flexible display panels. This way is difficult and not easy to implement. Another way is to start from the outside of the flexible display panel, for example, an additional protective cover is applied around the outer contour of the flexible display panel. Although this protective cover protects the flexible display panel well, because the protective cover tightly encloses the flexible display panel, it blocks the flexible display panel and needs to be removed first before displaying.

SUMMARY

In view of this, some exemplary embodiments provide a flexible element configured to be disposed on a flexible display panel, the flexible element including: a first base layer and a second base layer which are oppositely arranged; and, a buffer layer sandwiched between the first base layer and the second base layer, wherein the flexible element is configured to be capable of bending around a bending axis, and the projection of the buffer layer on a plane perpendicular to the bending axis is wave-shaped.

According to one aspect of some exemplary embodiments, the flexible element further comprises: a first fixing layer disposed between the first base layer and the buffer layer; and a second fixing layer disposed between the second base layer and the buffer layer.

According to one aspect of some exemplary embodiments, the first fixing layer and the second fixing layer are adhesive layers.

According to one aspect of some exemplary embodiments, the material of the buffer layer is metal.

According to one aspect of some exemplary embodiments, the metal is at least one of the following materials: shape memory alloy, spring steel, high hardness stainless steel, hardened aluminum, and aluminum alloy.

According to one aspect of some exemplary embodiments, the wave-shape is zigzag or sinusoidal shape.

According to one aspect of some exemplary embodiments, the first base layer and the second base layer are made of flexible material with bending recovery capability.

According to one aspect of some exemplary embodiments, the flexible element may include a wave-shaped buffer layer, or may include two or more wave-shaped buffer layers.

According to one aspect of some exemplary embodiments, when a plurality of wave-shaped buffer layers are included, adjacent wave-shaped buffer layers are separated by a spacer layer, and the spacer layer and each buffer layer can be adhered by an adhesive layer. In addition, when a plurality of wave-shaped buffer layers are included, each wave-shaped buffer layer may be different in shape and size from each other.

According to one aspect of some exemplary embodiments, the first base layer and the second base layer respectively define a plurality of apertures.

According to one aspect of some exemplary embodiments, the distribution density of the plurality of apertures in a bending region with a larger radius of curvature of the first base layer is greater than that in a bending region with a smaller radius of curvature of the first base layer; and the distribution density of the plurality of apertures in a bending region with larger curvature radius of the second base layer is greater than that in a bending region with a smaller curvature radius of the second base layer.

According to one aspect of some exemplary embodiments, each of the plurality of apertures extends in the same direction as the bending axis.

According to one aspect of some exemplary embodiments, the thickness of the buffer layer is 40-1000 microns in a direction perpendicular to the first base layer and the second base layer. Optionally, the thickness of the buffer layer is 30-300 microns.

Some exemplary embodiments also provide a flexible display device including at least one flexible element described above; an adhesive layer; and a flexible display panel, wherein a first base layer of the at least one flexible element and a non-display substrate of the flexible display panel are adhered together through the adhesive layer.

According to one aspect of some exemplary embodiments, the adhesive layer is a pressure sensitive adhesive (PSA).

According to one aspect of some exemplary embodiments, the at least one flexible element is a plurality of flexible elements that are stacked and adhered to each other.

Some exemplary embodiments also provide a manufacturing method of a flexible display device, including the following steps: providing at least one flexible element described above; providing a flexible display panel; and adhering the first base layer of the at least one flexible element and a non-display substrate of the flexible display panel together through an adhesive layer to form a flexible display device.

BRIEF DESCRIPTION OF DRAWINGS

Hereinafter, specific exemplary embodiments of a touch screen of the present disclosure will be exemplarily explained by referring to the drawings. In addition, it should be noted that the description does not limit the present disclosure in any way, and in the drawings.

DETAILED DESCRIPTION

Figure 1:
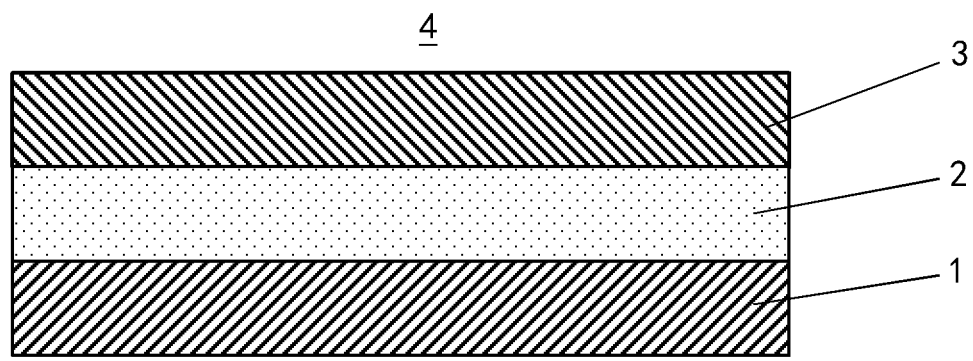
FIG. 1 is a schematic cross-sectional view of a flexible display device in an unbent state according to an exemplary embodiment.
Figure 2:
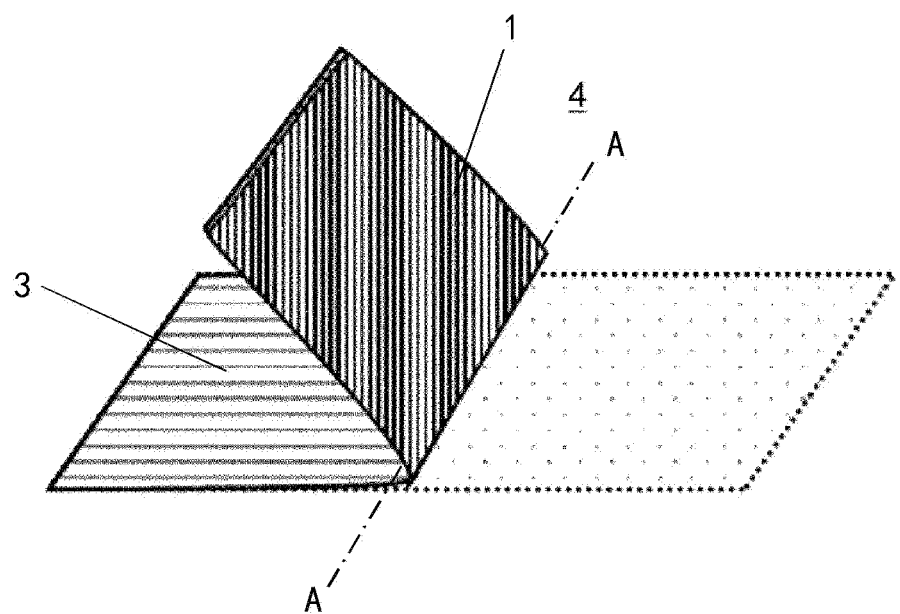
FIG. 2 schematically shows a perspective structural view of a flexible display device according to an exemplary embodiment in a bent state, wherein a flexible element is adhered to the entire back surface of the flexible display panel.
Figure 3:
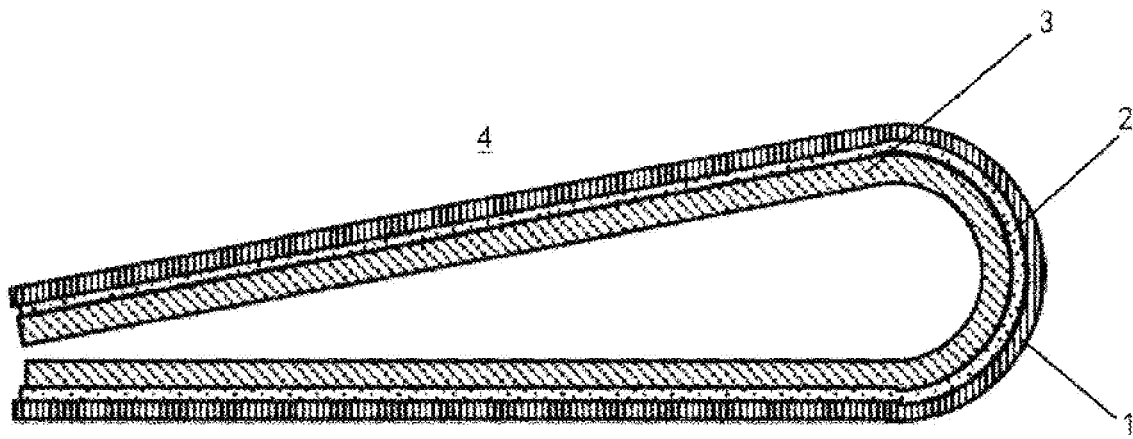
FIG. 3 schematically shows a cross-sectional view of a flexible display device according to an exemplary embodiment in a bent state, wherein a flexible element is adhered to the entire back surface of the flexible display panel.
Figure 4:
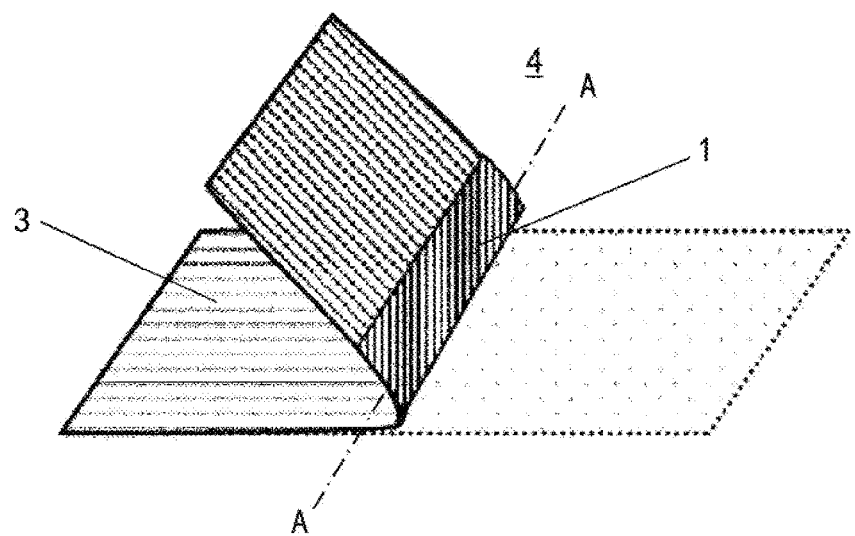
FIG. 4 schematically shows a perspective structural view of a flexible display device according to an exemplary embodiment in a bent state, wherein a flexible element is adhered to part of the back surface of the flexible display panel (partially adhered).
Figure 5:
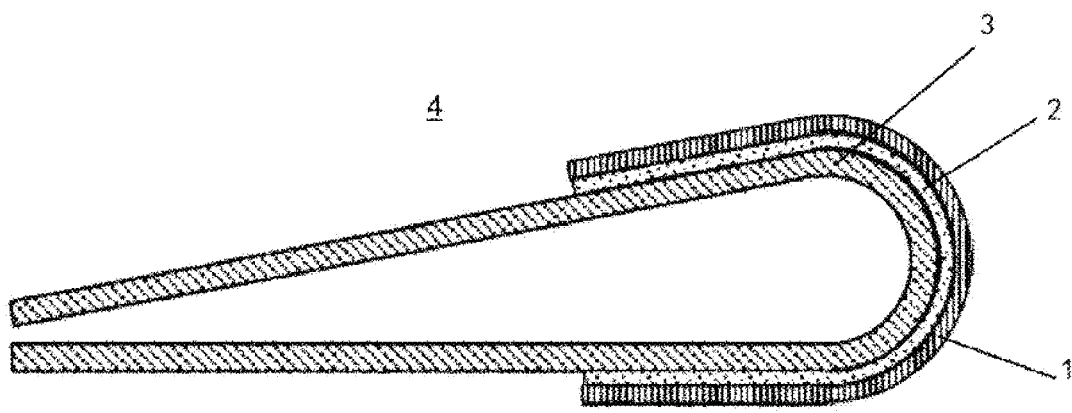
FIG. 5 schematically shows a cross-sectional view of a flexible display device according to an exemplary embodiment in a bent state, wherein a flexible element is adhered to part of the back surface of the flexible display panel.
Figure 6:
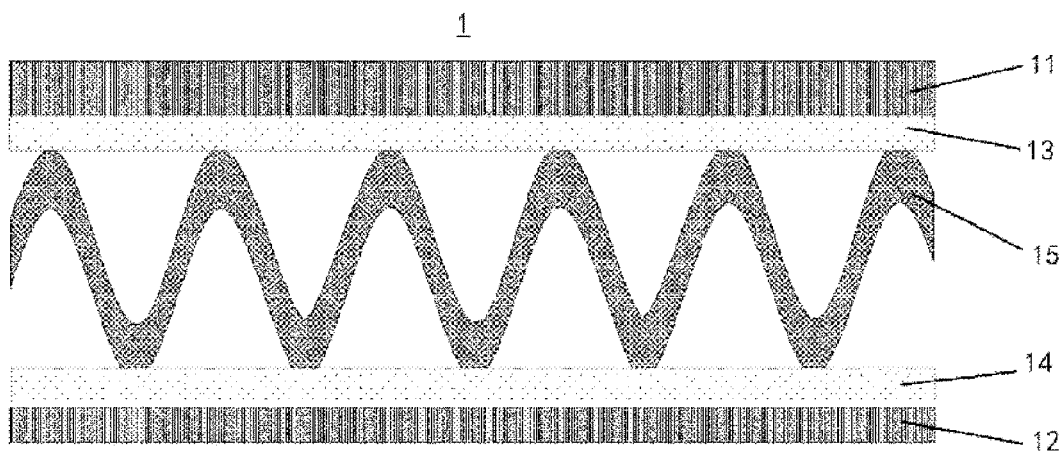
FIG. 6 schematically shows an enlarged cross-sectional view of a layer of flexible element in an unbent state according to an exemplary embodiment.
Figure 7:
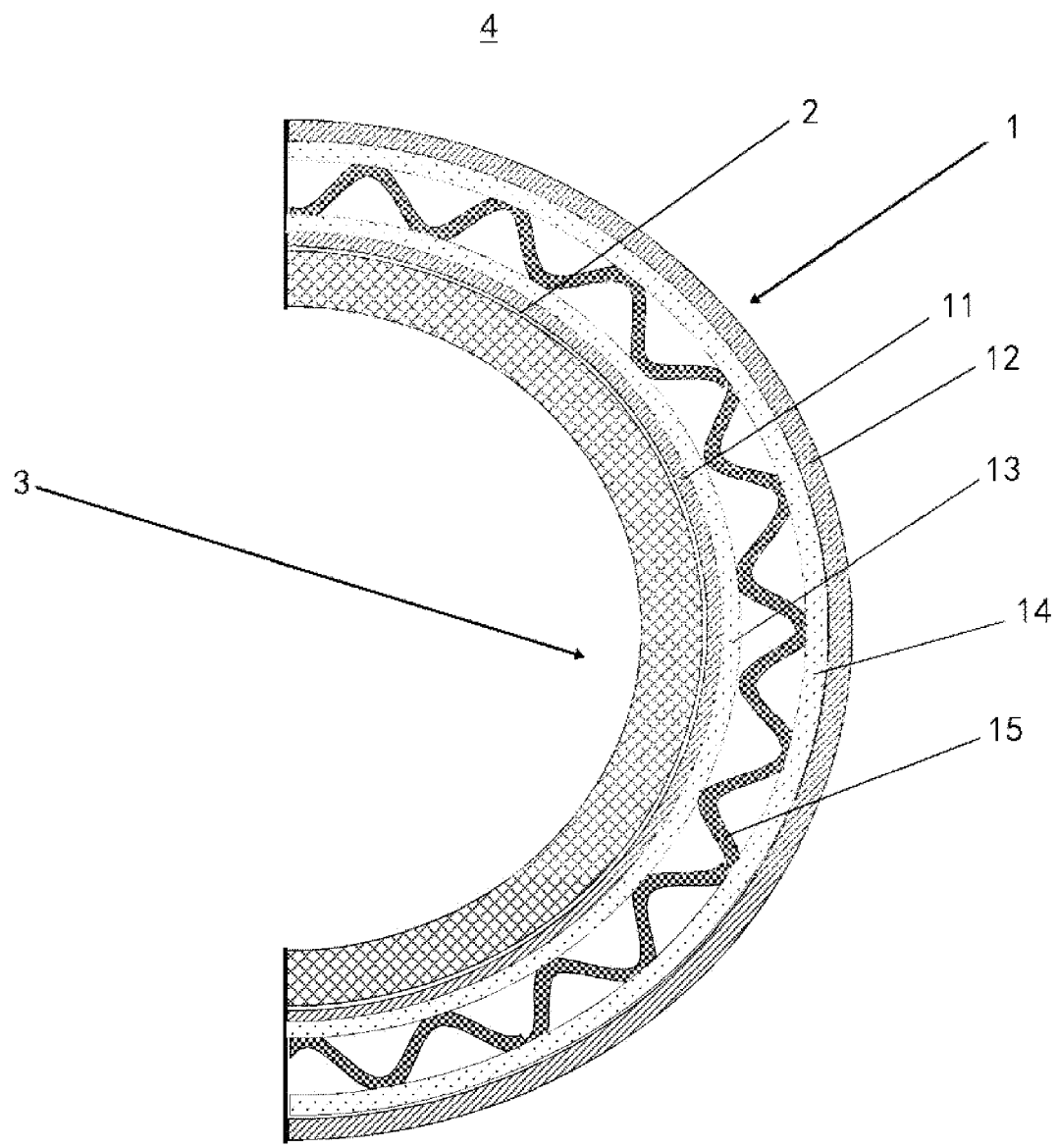
FIG. 7 schematically shows an enlarged cross-sectional view of a flexible display device including a layer of flexible element in a bent state according to an exemplary embodiment.

It is an object of exemplary embodiments to provide a flexible element which is configured to be disposed on a back surface of a flexible display panel to improve bending resistance and impact resistance thereof so that the flexible display panel can be displayed without first removing the flexible element when using the flexible display panel.

In order to achieve this object, some exemplary embodiments provide a flexible element which is configured to be disposed on a flexible display panel, the flexible element including: a first base layer and a second base layer which are oppositely disposed; and a buffer layer sandwiched between the first base layer and the second base layer, wherein the flexible element is configured to be capable of bending around a bending axis, and the projection of the buffer layer on a plane perpendicular to the bending axis is in a wave shape.

Because the flexible element has a level of mechanical strength and excellent flexibility, when it is disposed on the surface of the non-display substrate of the flexible display panel (i.e. the back surface of the flexible display panel), the overall strength of the flexible display panel can be improved, the impact resistance and bending resistance of the flexible display panel can be enhanced, the bending region can be supported, and the failure of "creases", "white lines" and the like caused by bending stress concentration can be avoided.

Referring to FIGS. 1-12 together, exemplary embodiments take an OLED display panel with top emission (i.e., the surface facing away from the flexible element 1 is the emitting surface, i.e., the display surface) as an example for detailed description. According to some exemplary embodiments, the flexible element 1 which is configured to be disposed on a surface of a non-display substrate (i.e., the back surface of the flexible display panel 3, i.e., the lower surface of the flexible display panel 3 in FIG. 1) of the flexible display panel 3 includes: a first base layer 11 and a second base layer 12 which are oppositely disposed; and a buffer layer 15 sandwiched between the first base layer 11 and the second base layer 12, wherein the flexible element 1 can be bent about a bending axis A-A, and the projection of the buffer layer 15 on a plane perpendicular to the bending axis is wave-shaped. Because the flexible element 1 has mechanical strength and excellent flexibility, when it is disposed on the surface of the non-display substrate of the flexible display panel 3, the overall strength, bending resistance and impact resistance of the flexible display panel 3 can be improved, the impact resistance and bending resistance of the flexible display panel 3 can be enhanced, the bending region can be supported, and the failure of "creases", "white lines" and the like caused by bending stress concentration can be avoided. Moreover, when the flexible display panel 3 is used as a display, it can display directly without first removing the flexible element.

Optionally, the flexible element 1 may further include a first fixing layer 13, disposed between the first base layer 11 and the buffer layer 15; and a second fixing layer 14 disposed between the second base layer 12 and the buffer layer 15. Thus, in such exemplary embodiments, two fixing layers 13, 14 are disposed between the first base layer 11, the second base layer 12 and the buffer layer 15 to facilitate better fixing of the buffer layer 15 in order to improve the support stability of the buffer layer 15 and the stress uniformity (load uniformity) experienced during support.

Further, the first fixing layer 13 and the second fixing layer 14 may be adhesive layers, which are mainly configured to fix the first base layer 11, the second base layer 12, and the buffer layer 15. The bending resistance of the whole flexible element 1 is further improved through the relative shear displacement of the adhesive layers and the creep of their microstructures.

Further, the wave-shape of the buffer layer 15 is a zigzag or sinusoidal shape, which is convenient to manufacture and reduces the manufacturing cost. The inventors have proved through experiments that setting the shape of the buffer layer 15 into zigzag or sinusoidal shape can well meet the requirements of the overall strength, impact resistance and bending resistance and the like of the flexible display panel 13.

Optionally, exemplary embodiments of the flexible element may comprise one wave-shaped buffer layer or two or more wave-shaped buffer layers. When a plurality of wave-shaped buffer layers are included, the adjacent wave-shaped buffer layers is separated by a spacer layer, and the spacer layer and each buffer layer can be adhered through an adhesive layer. In addition, when a plurality of wave-shaped buffer layers are included, each wave-shaped buffer layer may be different at least in one of a shape and a size from each other.

Optionally, in exemplary embodiments, the material of the buffer layer 15 may be metal (for example, may be in the form of a metal foil). In such exemplary embodiments, the metal is at least one of the following materials: shape memory alloy (for example, heat-stimulated shape memory alloy), spring steel, high-hardness stainless steel, hardened aluminum and aluminum alloy. For example, the shape memory alloy is superelastic titanium nickel alloy. The metal material enables the flexible element 1 to have mechanical strength, and ensures that the overall strength of the flexible display panel 13 can be improved when the flexible element 1 is disposed on the back surface of the flexible display panel 13. Specifically, when the metal material is shape memory alloy, the bending resistance and the bending recovery capability of the flexible display panel 13 can be enhanced. In addition, when the buffer layer 15 is made of metal foil, it is characterized by relatively good hardness and rigidity, high elastic strength limit, and good elastic recovery deformation capability. It should be noted that the material of the buffer layer 15 is not limited to metal as long as it can meet the requirements of supporting function and bending performance of corresponding flexible display device 4.

Optionally, the first base layer 11 and the second base layer 12 are made of flexible material with bending recovery capability. The first base layer 11 and the second base layer 12 are respectively planar base materials with certain strength and bending recovery capability, which can be made of the same material as the intermediate wave-shaped buffer layer 15, for example, metal.

Figure 10:
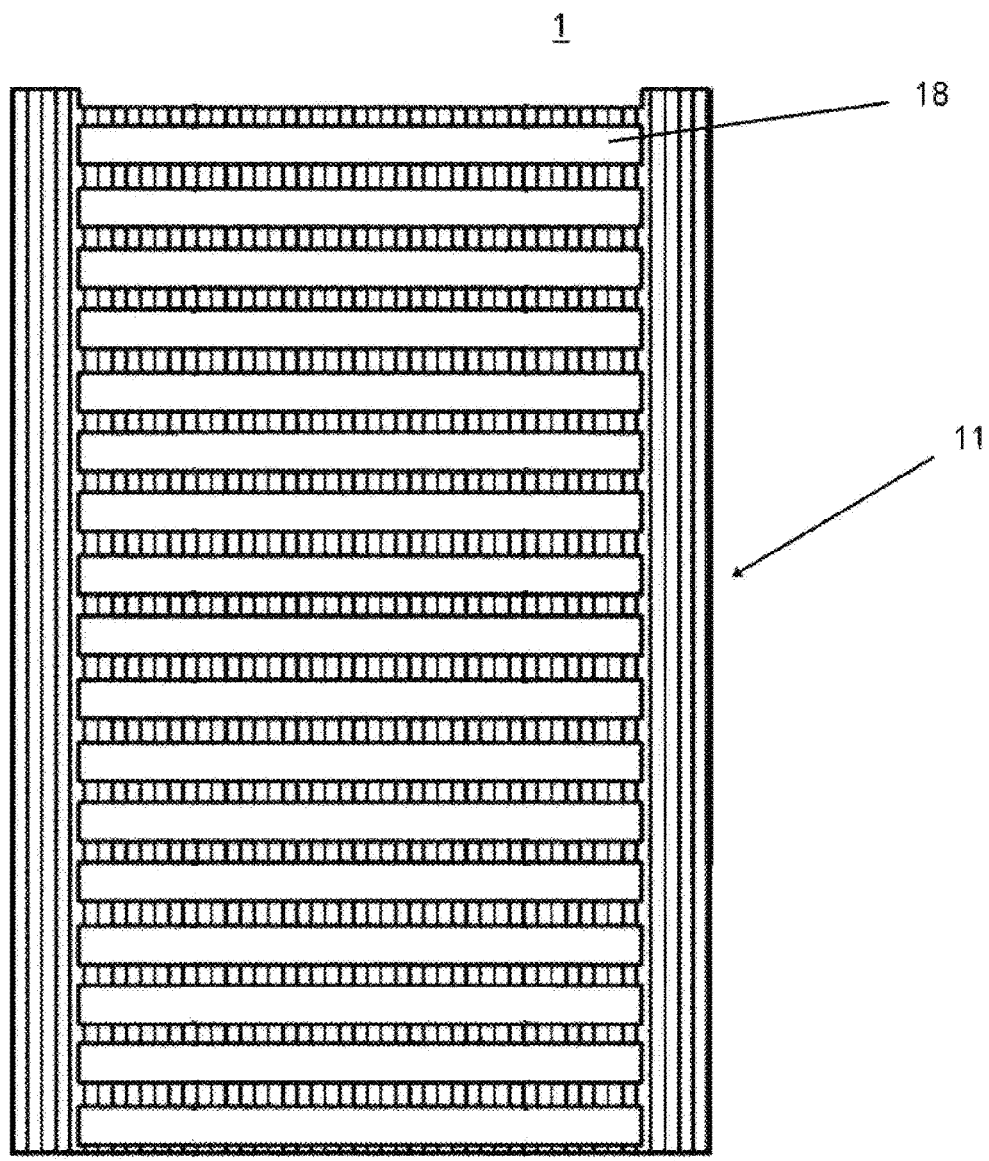
FIG. 10 schematically shows a top view of a flexible element defining a plurality of apertures according to an exemplary embodiment.
Figure 11:
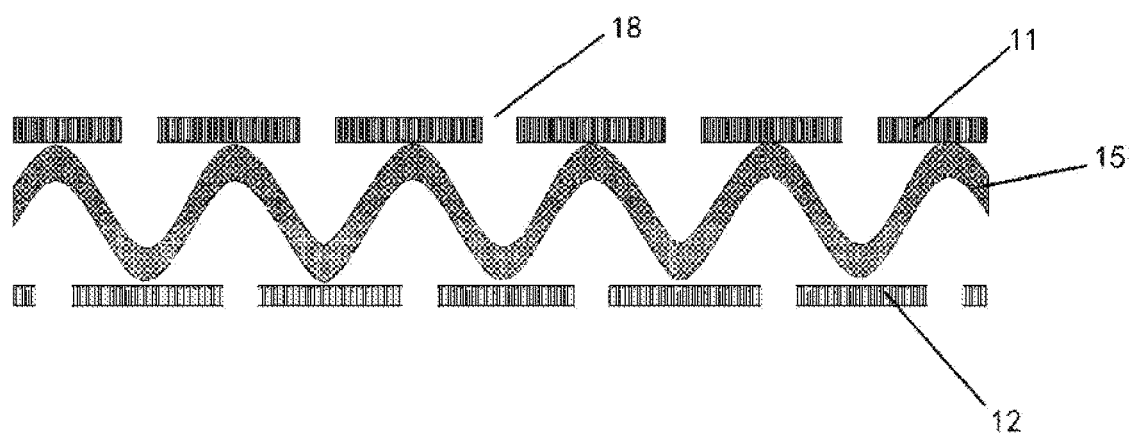
FIG. 11 schematically shows a cross-sectional view of a flexible element defining a plurality of apertures according to an exemplary embodiment.
Figure 12:
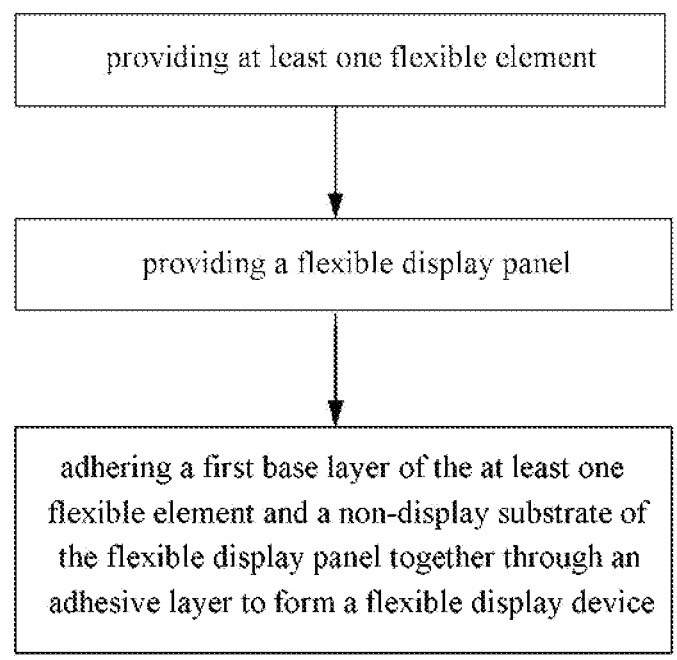
FIG. 12 is a schematic view of a manufacturing method of a flexible display device according to an exemplary embodiment.

Further, the first base layer 11 and the second base layer 12 respectively define a plurality of apertures 18 (see FIGS. 10-11). In certain exemplary embodiments, the extension direction of each aperture of the plurality of apertures is the same as the direction of the bending axis. By defining apertures 18 or grooves in the first base layer 11 and second base layer 12, the overall uniformity of stress subjected by the flexible element 1 is improved, and the overall deformation is dispersed, further improving the bending resistance of the flexible element 1. The manufacturing method of the apertures 18 is not limited to mechanical aperture forming process, and can be any patterning design process as long as the specific design shape of the first base layer 11 and second base layer 12 can be realized. For example, for this purpose, photolithography, laser processing, mechanical processing, etc. can be used.

Further, the distribution density of the plurality of apertures 18 in a bending region with a larger radius of curvature of the first base layer 11 is larger than that in a bending region with a smaller radius of curvature of the first base layer 11. The distribution density of the plurality of apertures 18 in a bending region with a larger radius of curvature of the second base layer 12 is larger than that in a bending region with a smaller radius of curvature of the second base layer 12. This arrangement can make the whole flexible element 1 bend as uniformly as possible to reduce the stress concentration of the base layer in the bending region and further improve the bending resistance. Therefore, "crease" and "white line" failures due to bending stress concentration can be avoided.

Optionally, in certain exemplary embodiments, the total thickness of the flexible element 1 is 50-3000 microns in a direction perpendicular to the first base layer 11 and the second base layer 12. The two endpoint values of 50 microns and 3000 microns are finally obtained by the inventor of the application through repeated experiments. Experiments show that if the total thickness of the flexible element 1 is less than 50 microns, the predetermined supporting function cannot be realized because it is too thin. If the total thickness of the flexible element 1 is more than 3000 microns, the bending performance requirement cannot be met. If the total thickness of the flexible element 1 is in the range of 50-3000 microns, both strength and flexibility requirements are met.

Optionally, in certain exemplary embodiments, the thickness of the buffer layer 15 is 40-1000 microns in a direction perpendicular to the first base layer and the second base layer. Optionally, the thickness of the buffer layer is 30-300 microns. The two endpoint values of 40 microns and 1000 microns are finally obtained by the inventor of the application through repeated experiments. Experiments show that if the thickness of the buffer layer 15 is less than 40 microns, the buffer function is insufficient; If the thickness of the buffer layer 15 is more than 1000 microns, the bending flexibility requirement cannot be met. If the thickness of the buffer layer 15 is in the range of 40-1000 microns, both buffering and flexibility requirements are met.

Another exemplary embodiment also provides a flexible display device 4 including at least one of the above-mentioned flexible elements 1; an adhesive layer 2; and a flexible display panel 3, wherein the first base layer 11 of the at least one flexible element 1 and a non-display substrate of the flexible display panel 4 are adhered together by the adhesive layer 2.

Figure 8:
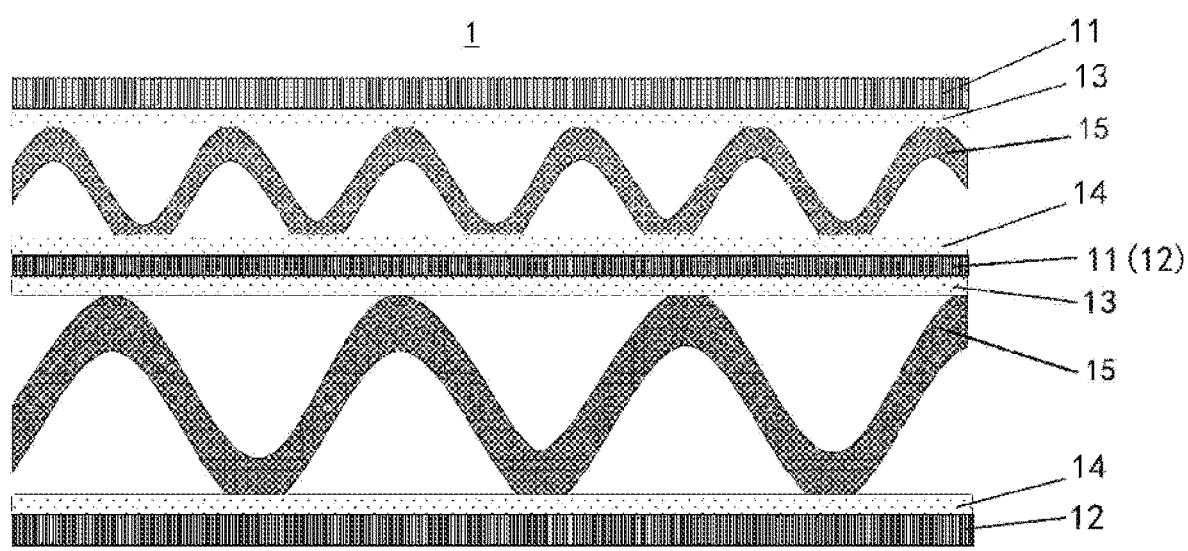
FIG. 8 schematically shows an enlarged cross-sectional view of two layers of flexible elements in an unbent state according to an exemplary embodiment.
Figure 9:
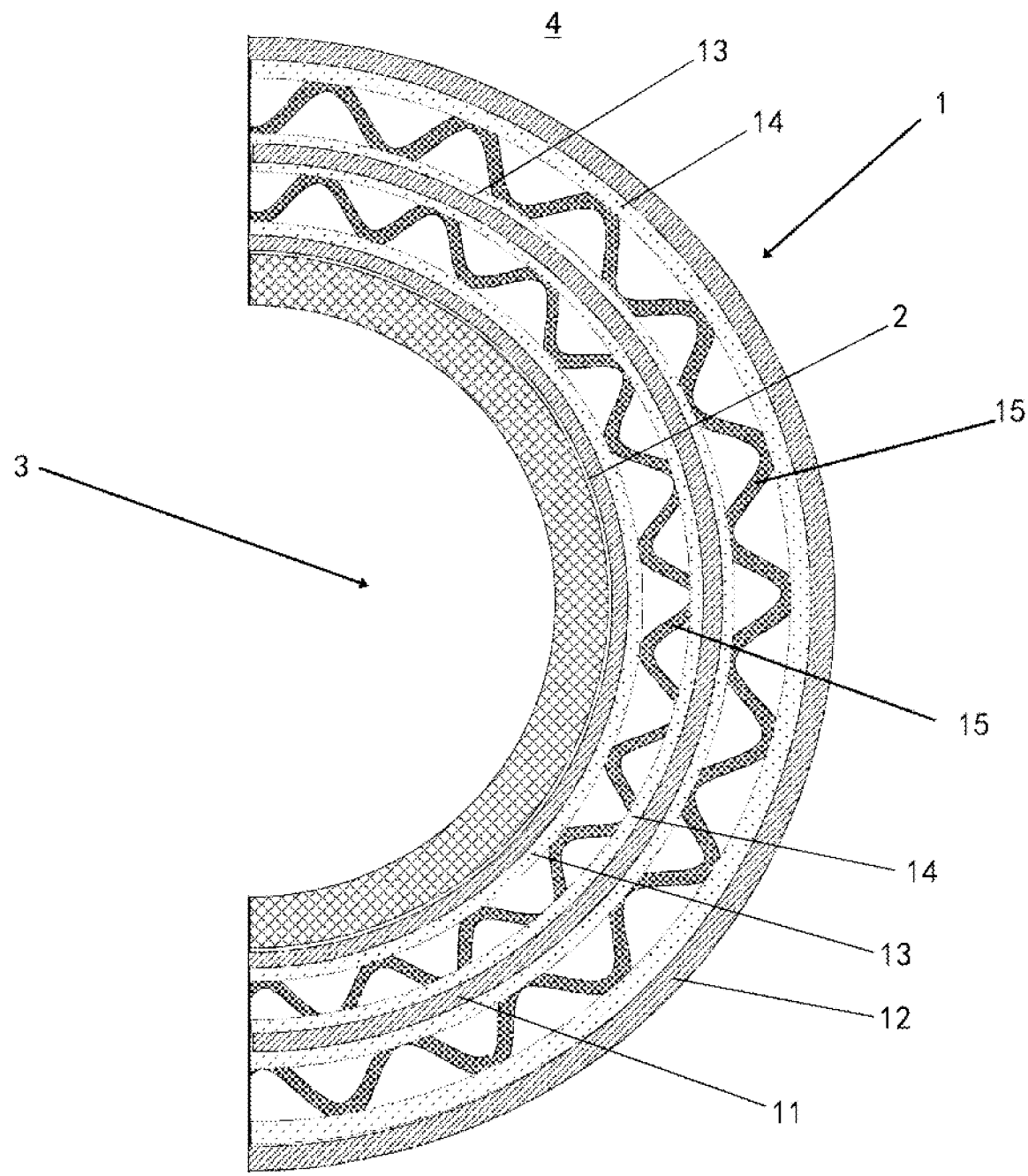
FIG. 9 schematically shows an enlarged cross-sectional view of a flexible display device including two layers of flexible elements in a bent state according to an exemplary embodiment.

In certain exemplary embodiments, the adhesive layer 2 is a pressure sensitive adhesive (PSA). The at least one flexible element 1 may be a plurality of flexible elements 1 that are stacked on top of each other and adhered together. For example, the two flexible elements 1 shown in FIGS. 8 and 9 are in the form of two layers.

Another exemplary embodiment also provides a manufacturing method of the flexible display device 4, including the following steps: providing at least one flexible element 1 described above; providing a flexible display panel 3; and adhering the first base layer 11 of the at least one flexible element and a non-display substrate of the flexible display panel 3 together through the adhesive layer 2 to form the flexible display device 4.

Taking a single-layer flexible element 1 as an exemplary embodiment, the step of providing the flexible element 1 specifically includes providing a first base layer 11 and a second base layer 12; providing a buffer layer 15; applying a first fixing layer 13 and a second fixing layer 14 having adhesive layers onto surfaces of the first base layer 11 and the second base layer 12 facing the buffer layer 15 respectively; Finally, fixedly interposing and adhering the buffer layer 15 between the first fixing layer 13 and the second fixing layer 14 to form the flexible element 1.

Because the flexible element 1 has certain mechanical strength and excellent flexibility, when it is disposed on a surface of the non-display substrate of the flexible display panel 3, the overall strength, bending resistance and impact resistance of the flexible display panel 3 can be improved, the impact resistance and bending resistance of the flexible display panel 3 can be enhanced, the bending region can be supported, and the failure of "creases", "white lines" and the like caused by bending stress concentration can be avoided. Moreover, when the flexible display panel 3 is used for display, it can display directly without first removing the flexible element.

It should be understood that although the basic structure, operation mechanism, various features and beneficial effects of the present disclosure and the specific details of the present disclosure have been set forth in the above description, these contents are merely exemplary, and the specific details thereof, especially within the scope of the principles of the present disclosure, may be specifically changed to the overall scope represented by the broad general meaning claimed in the claims of the present disclosure.

The words "a" or "an" in the claims of the present disclosure do not exclude plural numbers, and are only intended for convenience of description and should not be construed as limiting the scope of protection of the present disclosure. In this disclosure, the terms "first" and "second" are used for descriptive purposes only, and are not to be understood as indicating or implying relative importance, nor are they necessarily used to describe a sequential order or a temporal order. The term "plurality" refers to two or more unless explicitly defined otherwise. "Up", "Down", "Left" and "Right" are only used to indicate the relative positional relationship. When the absolute position of the described object changes, the relative positional relationship may also change accordingly. The term "comprising" may refer to "consisting of" in exemplary embodiments, but may also refer to "including at least a defined category and optionally one or more other categories" in other exemplary embodiments. Some exemplary embodiments may be described by using the expression "one embodiment" or "some embodiments" along with their derivatives. These terms mean that a specific feature, structure, or characteristic described in connection with an exemplary embodiment is included in at least one such embodiment. The phrase "in one embodiment" or in one exemplary embodiment, appearing in various places in the application does not necessarily all refer to the same embodiment. The term "and/or" specifically refers to one or more of the items mentioned before and after "and/or". For example, the phrase "item 1 and/or item 2" and similar phrases may relate to one or more of items 1 and 2. Those skilled in the art will understand the term "substantially" herein, such as in "substantially consisting of". The term "substantially" may also include embodiments having "wholly," "completely," "all," etc. Therefore, in the embodiment, the adjective is also substantially removable. Where applicable, the term "substantially" may also refer to 90% or more, such as 95% or more, specifically 99% or more, even more specifically 99.5% or more, including 100%.

Unless otherwise defined, all technical and scientific terms used in this specification have the same meaning as commonly understood by those skilled in the art to which this disclosure belongs.

It should be understood that the flexible element, the flexible display device and the manufacturing method thereof of the present disclosure are not limited to those described in the above examples. Any variations occurring to any person skilled in the art, after reading the present disclosure, will be covered in the scope of claims of the present disclosure if he or she combines with the prior art without creative efforts.

The invention claimed is:

1. A flexible element configured to be disposed on a flexible display panel, the flexible element comprising:
   a first base layer and a second base layer which are oppositely arranged with each other; and
   at least one buffer layer sandwiched between the first base layer and the second base layer,
   wherein the flexible element is capable of bending around a bending axis, and a projection of the at least one buffer layer on a plane perpendicular to the bending axis is in a wave shape,
   wherein the first base layer and the second base layer respectively define a plurality of apertures therein, and
   wherein a distribution density of the plurality of apertures in a bending region with a larger radius of curvature of the first base layer is greater than that in a bending region with a smaller radius of curvature of the first base layer; and the distribution density of the plurality of apertures in a bending region with a larger curvature radius of the second base layer is greater than that in the bending region with a smaller curvature radius of the second base layer.

2. The flexible element of claim 1, further comprising:
   a first fixing layer disposed between the first base layer and the at least one buffer layer; and
   a second fixing layer disposed between the second base layer and the at least one buffer layer.

3. The flexible element according to claim 2, wherein the first fixing layer and the second fixing layer are adhesive layers.

4. The flexible element according to claim 1, wherein a material of the at least one buffer layer comprises metal.

5. The flexible element according to claim 4, wherein the metal is selected from at least one of following materials: a shape memory alloy, a spring steel, a high-hardness stainless steel, a hardened aluminum, and an aluminum alloy.

6. The flexible element according to claim 1, wherein the wave shape is selected from one of a zigzag or sinusoidal shape.

7. The flexible element according to claim 1, wherein the first base layer and the second base layer are made of a flexible material with a bending recovery capability.

8. The flexible element according to claim 1, wherein the at least one buffer layer is a plurality of buffer layers, adjacent buffer layers are separated by a spacer layer, the spacer layer and each buffer layer are adhered by an adhesive layer, and the plurality of buffer layers are different from each other at least in one of shape and size.

9. The flexible element of claim 1, wherein an extension direction of each of the plurality of apertures is the same as a direction of the bending axis.

10. A flexible display device comprising:
   at least one flexible element, each of the at least one flexible elements comprising:
      a first base layer and a second base layer which are oppositely arranged with each other; and
      at least one buffer layer sandwiched between the first base layer and the second base layer, wherein the flexible element is capable of bending around a bending axis, and a projection of the at least one buffer layer on a plane perpendicular to the bending axis is in a wave shape, and wherein the first base layer and the second base layer respectively define a plurality of apertures therein, and a distribution density of the plurality of apertures in a bending region with a larger radius of curvature of the first base layer is greater than that in a bending region with a smaller radius of curvature of the first base layer; and the distribution density of the plurality of apertures in a bending region with a larger curvature radius of the second base layer is greater than that in the bending region with a smaller curvature radius of the second base layer;
   an adhesive layer; and
   comprising a non-display substrate,
   wherein the first base layer of the at least one flexible element and the non-display substrate of the flexible display panel are adhered together through the adhesive layer.

11. The flexible display device according to claim 10, wherein the adhesive layer is a pressure sensitive adhesive.

12. The flexible display device according to claim 11, wherein the at least one flexible element is a plurality of flexible elements, and the plurality of flexible elements are stacked and adhered to each other.

13. The flexible display device according to claim 10, wherein the flexible element further comprises:
   a first fixing layer disposed between the first base layer and the at least one buffer layer; and
   a second fixing layer disposed between the second base layer and the at least one buffer layer.

14. The flexible display device according to claim 10, wherein the flexible element is adhered to an entire back surface of the flexible display panel.

15. The flexible display device according to claim 10, wherein the flexible element is adhered to part of a back surface of the flexible display panel.

16. The flexible display device according to claim 10, wherein the wave shape is a zigzag or sinusoidal shape.

17. A manufacturing method of a flexible display device, comprising steps of:
   providing at least one flexible element, each of the at least one flexible elements comprising:
      a first base layer and a second base layer which are oppositely arranged with each other; and
      at least one buffer layer sandwiched between the first base layer and the second base layer, wherein the flexible element is capable of bending around a bending axis, and a projection of the at least one buffer layer on a plane perpendicular to the bending axis is in a wave shape, and wherein the first base layer and the second base layer respectively define a plurality of apertures therein, and a distribution density of the plurality of apertures in a bending region with a larger radius of curvature of the first base layer is greater than that in a bending region with a smaller radius of curvature of the first base layer; and the distribution density of the plurality of apertures in a bending region with a larger curvature radius of the second base layer is greater than that in the bending region with a smaller curvature radius of the second base layer;
   comprising a non-display substrate; and
   adhering the first base layer of the at least one flexible element and the non-display substrate of the flexible display panel together through an adhesive layer to form the flexible display device.

* * * * *